United States Patent [19]

Dagan

[11] Patent Number: 5,351,748

[45] Date of Patent: Oct. 4, 1994

[54] TUBULAR PIN FIN HEAT SINK FOR ELECTRONIC COMPONENTS

[76] Inventor: Baruch Dagan, 296 Torresdale Ave., Toronto, Ontario, Canada, M2R 3N3

[21] Appl. No.: 6,647

[22] Filed: Jan. 21, 1993

[51] Int. Cl.$^5$ .................................................. F28F 7/00
[52] U.S. Cl. .................................. 165/80.3; 165/185; 29/890.044; 174/16.3; 361/690; 361/703
[58] Field of Search ................ 165/803, 185; 361/383, 361/384, 690, 703; 174/16.3; 29/522.1, 890.044, 890.043

[56] References Cited

U.S. PATENT DOCUMENTS

| | | | |
|---|---|---|---|
| 1,900,099 | 3/1933 | Ferguson | 29/522.1 |
| 4,204,312 | 5/1980 | Tooker | 29/890.044 |
| 4,291,364 | 9/1981 | Andros et al. | 361/384 |
| 4,546,405 | 10/1985 | Hultmark et al. | 361/386 |
| 4,570,317 | 2/1986 | Veling et al. | 29/522.1 X |
| 4,733,453 | 3/1988 | Jacoby | 29/432 |
| 4,761,866 | 8/1988 | Murphy | 29/890.044 |
| 5,097,590 | 3/1992 | Tokura | 29/890.044 X |
| 5,158,136 | 10/1992 | Azar | 165/185 |

FOREIGN PATENT DOCUMENTS 0246432  11/1987  European Pat. Off. ........... 174/16.3

OTHER PUBLICATIONS

Redmond, R. J., High Thermal-Transfer Module, IBM Technical Disclosure Bulletin, vol. 24, No. 3 pp. 1668–1669, Aug. 1981.

*Primary Examiner*—John Rivell
*Attorney, Agent, or Firm*—Adrian Zahl

[57] ABSTRACT

A heat sink is provided, comprising a base with an array of tubular pins extending outwardly therefrom. The pins are engaged within apertures recessed into the base by means of an expansion member positioned within the tubular portion of each pin, wherein the expansion member causes the wall of the pin to deform outwardly to clampingly engage the pin within the aperture.

6 Claims, 5 Drawing Sheets

SECTION 1—1

TUBULAR PIN FIN HEAT SINK FOR ELECTRONIC COMPONENTS

FIELD OF THE INVENTION

The present invention relates to heat sink devices, for use in air-cooled electronic devices or components, that employ natural or forced air convection for removal of excess heat.

BACKGROUND OF THE INVENTION

Heat sinks for use in air-cooled electronic components must meet several requirements: they must maximize their surface area for maximum heat absorbtion and dissipative qualities; they must be compact; and they should be capable of relatively inexpensive manufacture. Ideally, they should be capable of manufacture in any configuration, in order to meet the various requirements of different electronic components with respect to size, shape and cooling capacity.

A Heat sink typically comprises either an independent unit mounted inside the case of an electronic device, or it is incorporated into a power source or other heat-generating component of an electronic device. Inexpensive heat sink devices for air-cooled electronic devices are typically fabricated from extruded aluminum and comprise one or more arrays of fins extending parallel to each other from a base. Air may be forced between the fins by means of a fan.

A more advanced type of heat sink is the pin fin type of heat sink, comprising an array of pins, usually cylindrical, extending from a base. Examples of the pin fin type heat sink are disclosed in U.S. Pat. Nos. 4,291,364 (Andros et al.), 4,546,405 (Hultmark et al.) and 4,733,483 (Jacoby et al.). An advantage of the pin fin type of heat sink is that it is multidirectional with natural convection; it functions equally well in any orientation, while the ordinary tinned heat sink is fully functional with natural convection only when the fins are oriented vertically.

A pin fin heat sink may comprise either a single casting, or the pins may be mounted to a base. A heat sink having separately mounted pins can be significantly less expensive than a cast unit. As well, the use of separate pins allows for the provision of a base fabricated of aluminum or other relatively light and inexpensive metal, and pins made of a highly conductive (but more expensive) metal such as brass or copper engaged to the base, for a device having lighter weight and greater heat conductive qualities. A further disadvantage of a cast unit resides in the difficulty and expense in fabricating heat sinks having varying sizes, shapes, and pin configurations, in order to meet the various requirements of different electronic devices, since each change requires the fabrication of a new mould. As well, cast metal is porous and its thermal qualities may differ from part to part. The use of separately attachable pins overcomes these drawbacks.

A drawback of a pin fin heat sink wherein the pins are mounted to the base, instead of a unit comprising a one-piece casting, is the difficulty in engaging the pins to the base in such a manner that the assembly of the device is rapid, but ensuring that intimate contact is maintained between the pins and the base, in order to maintain effective heat transfer between the base and the pins.

It is desirable as well to provide a pin fin heat sink wherein the pins are tubular rather than solid. The term "tubular" as used herein refers to any cross sectional configuration having a hollow interior. The use of a tubular pin achieves several benefits, including greater heat absorbtion and dissipation, and cost and weight savings through the reduction in material required to fabricate the device.

In order to provide a heat sink with tubular pins, the pins should capable of being readily mounted to the base in such a manner that intimate contact between the base and pin is maintained. This object has not heretofore been satisfactorily achieved.

OBJECTS OF THE INVENTION

It is an object of the present invention to provide a heat sink comprised of an array of tubular pins mounted to a base. It is a further object of the invention to provide a rapid, inexpensive means to engage the pins to the base, that results in an intimate contact between pin and base, and a method of assembling the heat sink.

BRIEF DESCRIPTION OF THE INVENTION

The present invention is a heat sink device for use in an air cooled electronic component, comprising an array of pins extending outwardly from a base. At least one of the pins is provided with a tubular portion. The pin is mounted to the base by means of an expansion member inserted into an open end of the pin that causes the pin to deform outwardly to clampingly engage an aperture within the base. The invention further comprises a method of assembling a heat sink, comprising the steps of inserting a lower end of a pin having a tubular portion into a corresponding aperture within the base; inserting an expansion member into an open upper end of the pin; and forcing the expansion member through the open interior of said pin into a lower portion thereof, causing the expansion of the pin outwardly. The outward expansion of the pin causes its outer wall to clampingly engage the pin within said aperture.

In an embodiment, the hollow interior of the pin describes a stepped configuration, wherein the interior of an upper portion of the pin has a larger diameter than the interior of a lower part of the pin. In this second embodiment, the expansion member may freely slide through the upper portion, and engages the wall of the lower portion to deform it outwardly, as in the first embodiment.

It will be understood that references herein to directional terms such as "upwardly" refer to a heat sink with the base positioned horizontally and the pins extending upwardly therefrom. It will be apparent that a heat sink may be oriented in any direction, and the present directional references are applied for convenience only.

DETAILED DESCRIPTION OF THE PREFERRED EMBODIMENT

Figure 1:
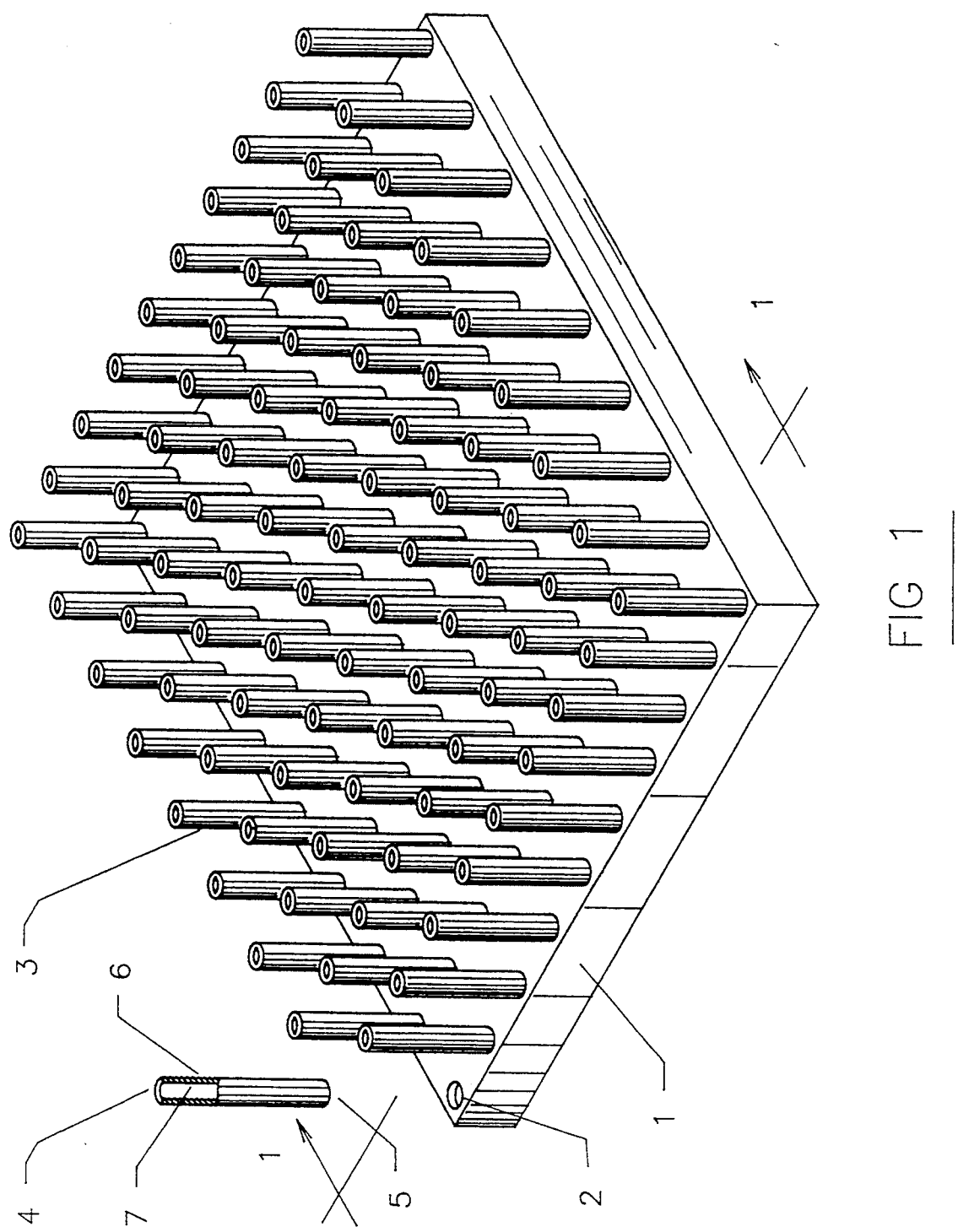
FIG. 1 is a perspective view of the device, illustrating a heat sink device according to the present invention with one of the pins removed and shown partly cut away.

A heat sink according to the present invention is comprised of a base plate having an array of tubular pins extending upwardly therefrom. Referring to FIG. 1, the base plate 1 comprises a generally rectangular aluminum plate which may be cold rolled, extruded or comprised of machined plate, having an array of apertures 2 extending partway therethrough and opening to the upper surface thereof.

A tubular pin 3, having a circular cross section and open upper and lower ends 4 and 5, respectively, and which is preferably fabricated of copper, brass or aluminum, or any other material having a relatively high conductivity, is engaged within each aperture 2. The pin has interior and exterior faces 6 and 7, respectively. When positioned within the aperture 2, the upper end 4 of the pin remains exposed, with the lower end 5 thereof being positioned within the aperture 2. The length and wall thickness of the pins 3, as well as the spacing between the pins within the array and the size and shape of the base plate, will vary depending on the desired heat dissipative qualities of the heat sink and space considerations of the electronic component within which the device is installed.

Figure 2:
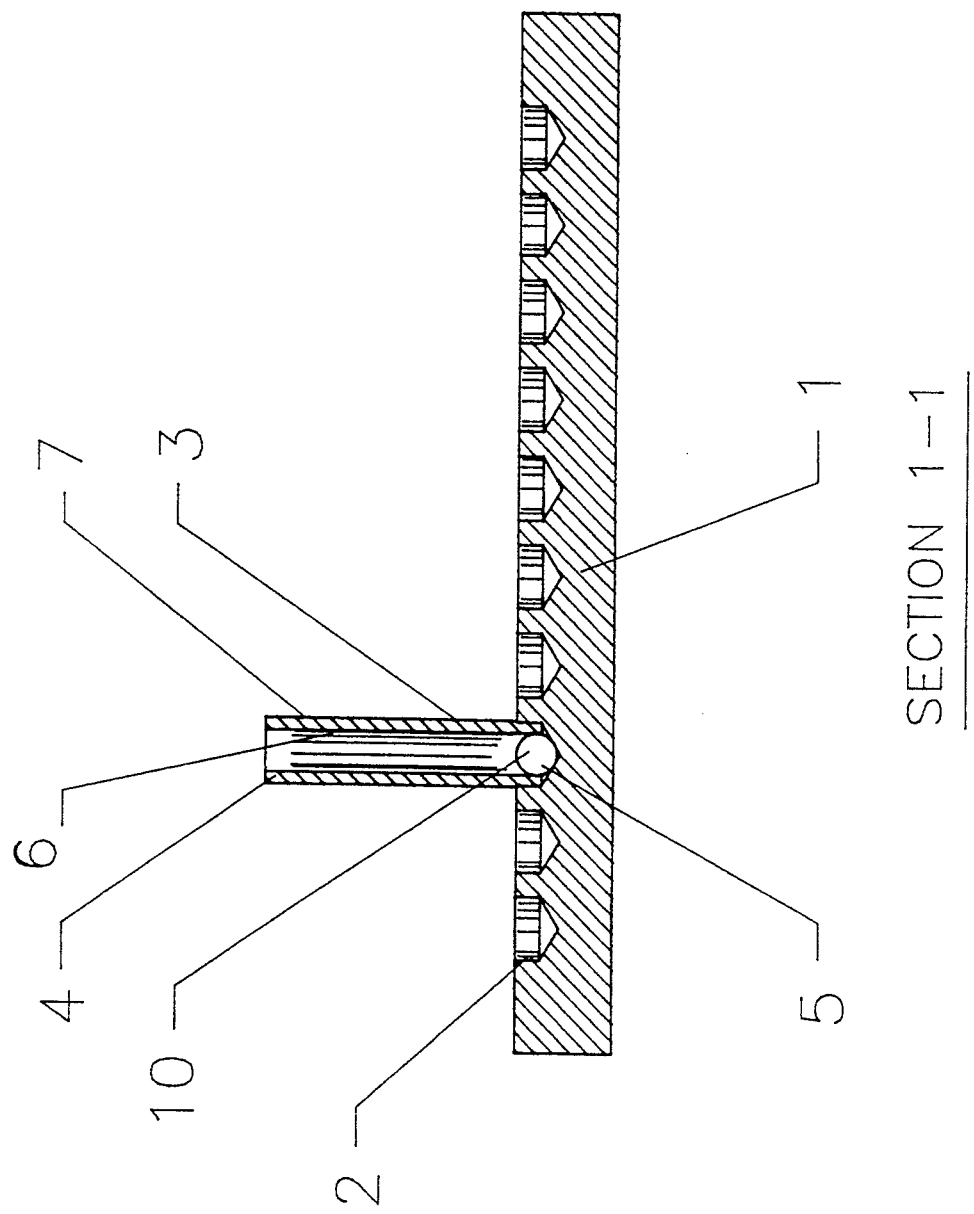
FIG. 2 is a sectional view along line a—a of FIG. 1, with all but one pin removed.

Referring to FIG. 2, each pin 3 is engageable within a corresponding aperture 2. It is not necessary to provide a snug fit between the exterior face 7 of the pin and the aperture; a relatively loose fit is sufficient. An expansion member, comprising a bearing 10, is retained within the lower end of each pin 3. The bearing 10 engages the interior face 6 of the pin and, when in position in a lower portion of the pin, serves to deform the wall of the lower end of the pin outwardly, such that the exterior wall 7 of the pin clampingly engages the aperture 2 to fixedly engage the pin to the base and ensure intimate contact therebetween. The bearing 10 may be made of stainless steel, brass, beryllium copper, or any other material that is harder than the material selected for the pins. The diameter of the bearing 10 is slightly larger than the inside diameter of the pin, in order to deform the wall of the pin outwardly when the bearing is positioned within the pin. In one embodiment, the inside diameter of the pin is 0.187 inches and the diameter of the bearing is 0.195 inches.

The bearing 10 is positioned within the pin 3 by being forced into the open upper end 4 subsequent to the pin being positioned within the aperture 2, and being pressed downwardly into the lower end of the pin.

Figure 3:
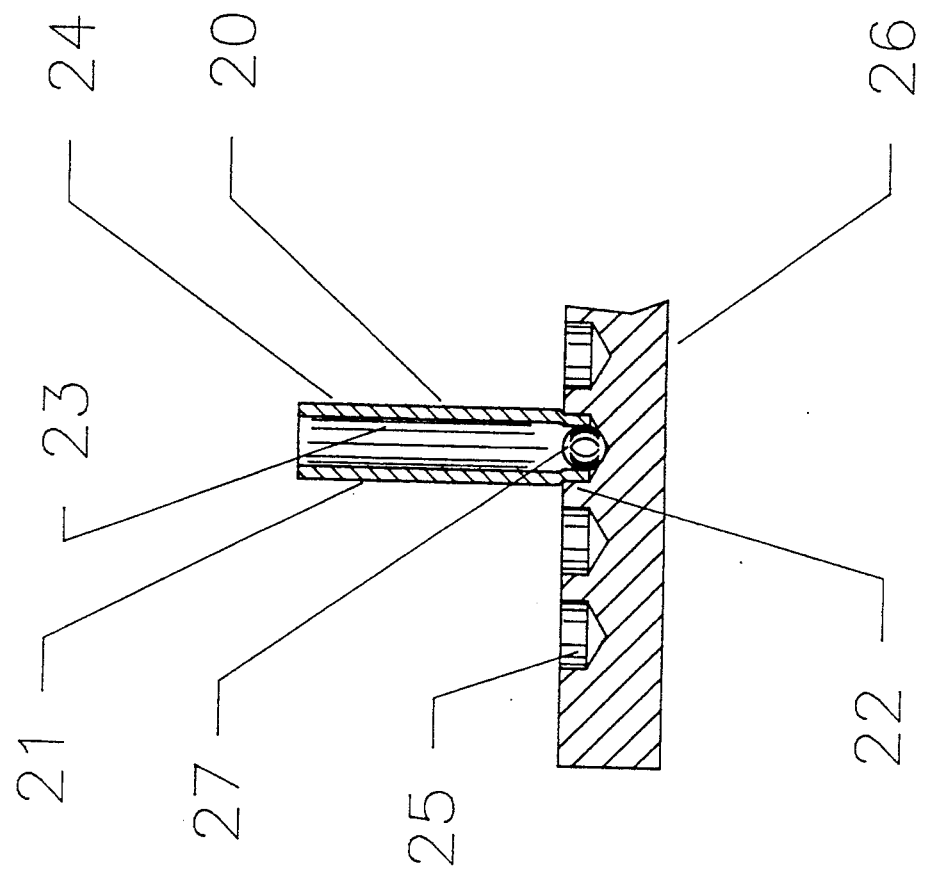
FIG. 3 is a sectional view as in FIG. 2, illustrating a second embodiment of the invention.

In a second embodiment of the invention, shown in FIG. 3, the pin is provided with a hollow interior having a stepped interior configuration. In this embodiment, the upper end of the pin has a larger diameter than the lower end thereof, in order to facilitate the insertion of the expansion member into the base of the pin.

As illustrated in FIG. 3, tubular pins 20 have upper and lower portions 21 and 22, respectively, and interior and exterior faces 23 and 24, respectively. The length of the lower portion 22 is generally equal to the length of apertures 25 recessed within base plate 26. The lower portion 22 is swaged, the diameter thereof being slightly smaller than that of the upper portion 21. An expansion member, comprising a bearing 27, is retained within lower portion 22 of the pin. The bearing 27 has a diameter slightly smaller than the inside diameter of the upper portion 21 of the pin and slightly larger than the diameter of the lower portion 22. When positioned within the lower portion of the pin, the bearing 27 engages the interior face 23 of the lower portion of the pin and deforms the lower portion outwardly sufficiently to clampingly engage the exterior face 24 with the aperture 25.

The device may be assembled by inserting the bearing 27 into the open upper end of the pin 20. The bearing is able to slide freely through the interior of the upper portion of the pin, until it lodges against the lower portion of the pin. At this point it may be forced downwardly in the same manner as with the first embodiment hereof, deforming the wall of the pin outwardly and retaining the pin within the aperture as aforesaid.

In an example, the inside diameter of the upper portion 21 of the pin is 0.200 inches and the inside diameter of the lower portion of the pin is 0.187 inches, with the diameter of the bearing being 0.195 inches.

Figure 4:
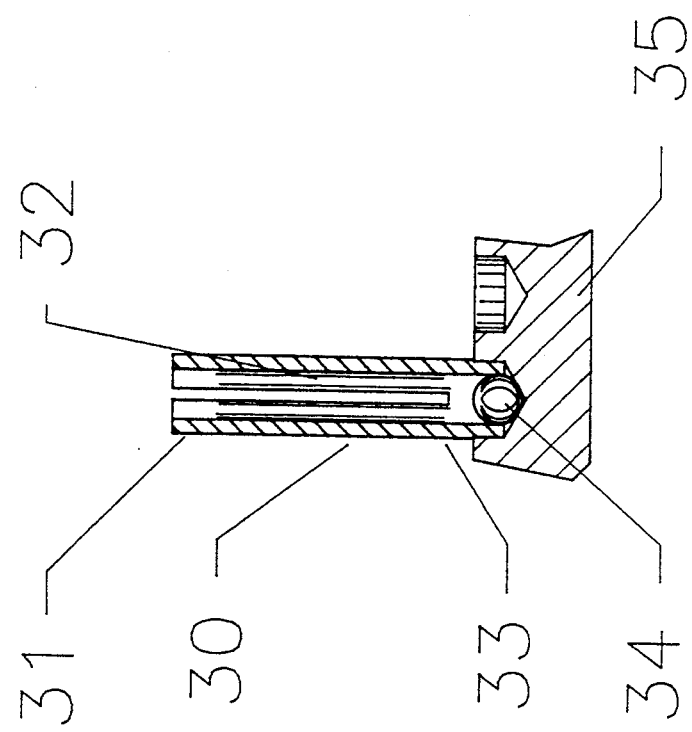
FIG. 4 is a sectional view as in FIG. 2 of a portion of a third embodiment of the device.

In a third embodiment of the invention, shown in FIG. 4, the pin 30, having a clindrical tubular shape as in the first embodiment, is comprised of an upper portion 31 having a vertical slot 32 extending form the upper rim of the pin the length of the upper portion, and a lower portion 33, having the same inside diameter as the upper portion. An expansion member 34, which may comprise a bearing, is inserted as in the first embodiment hereof into the open upper end of the pin. The expansion member is forced downwardly through the upper portion 31 of the pin, the slot 32 allowing the upper portion to expand to sufficiently to receive the expansion member. The expansion member is subsequently forced downwardly through the lower portion 33, causing the wall thereof to deform outwardly, as in the first embodiment hereof, to clampingly engaging the pin within an aperture of the base 35. It will be seen that in this embodiment, plastic deformation of the wall of the pin does not occur in the upper portion 31, facilitating insertion of the expansion member downwardly through the interior of the pin.

Figure 5:
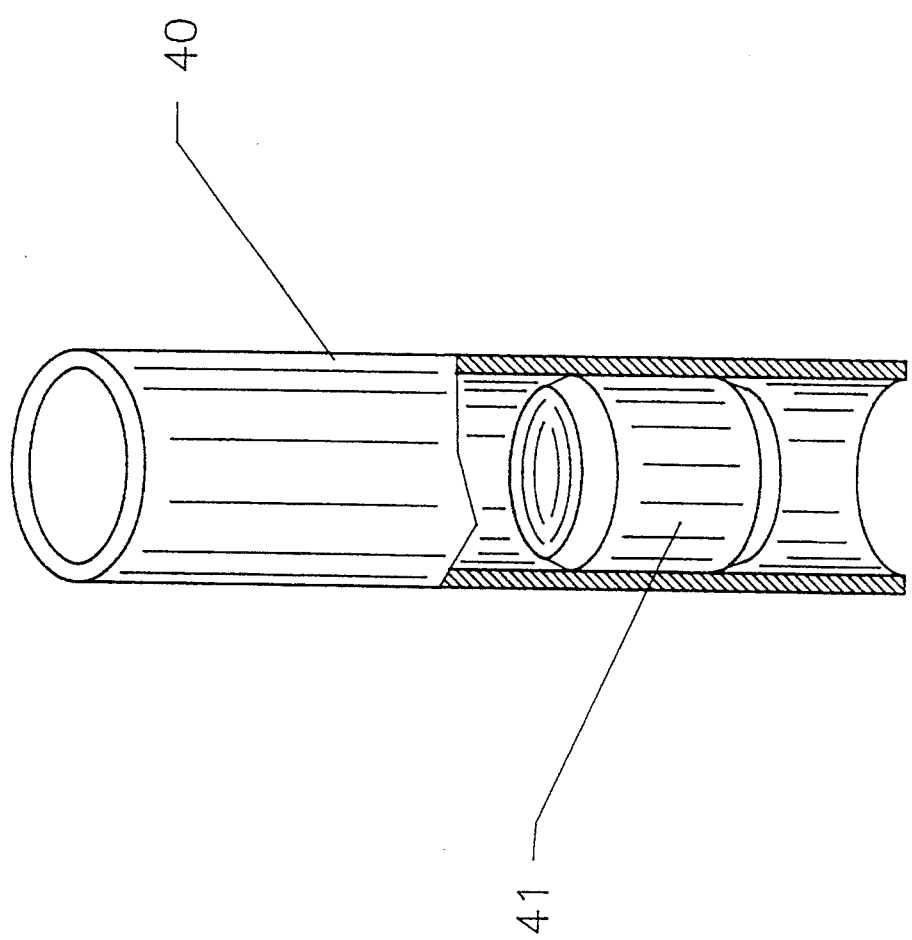
FIG. 5 is a side elevational view, partly cut away, of a pin, illustrating a fourth embodiment of the invention.

As shown in FIG. 5, the expansion member may comprise a plug, such as a short cylinder or other like member having a circular cross section having generally the same diameter as the bearing employed in the other embodiments hereof. In this fourth embodiment, a tubular pin 40 is provided, shown here as having a constant interior diameter as in the first embodiment hereof; it will be understood that the expansion member of this embodiment may be employed with any embodiment of the present invention. An expansion member 41, comprising a short cylinder, is provided. The expansion member is inserted into an open upper end of the pin and forced downwardly, causing outward deformation of the wall of the pin and clampingly engaging it within an aperture recessed within a base, no% shown, in the same manner as in the previously-described embodiments hereof.

It will be further understood that in the event that a pin is selected wherein the cross-sectional configuration of the interior face is other than circular, the expansion member may comprise a member having the same cross-sectional configuration as the interior of the pin.

It will be obvious to those having ordinary skill in the art that many changes may be made in the details of the preferred embodiments described above, without departing from the spirit and scope of the invention, as defined by the appended claim.

I claim:

1. A heat sink for use in an air-cooled electronic component, comprising an array of pins extending from a base, at least one of said pins comprising a tube having an interior wall having a stepped configuration wherein an upper portion of said tube has an interior diameter larger than the interior diameter of a lower portion thereof, said lower portion being engaged to said base by means of an expansion member within said lower portion, said expansion member being adapted to pass freely through the upper portion of said tube and to engage the interior wall of the lower portion of said tube to expand said lower portion outwardly to fixedly engage said tube within an recess within said base.

2. A heat sink as claimed in claim 1 wherein said expansion member causes plastic deformation outwardly of the lower portion of the pin, sufficiently to clampingly engage the pin exterior face of the tubular portion to an aperture within the base.

3. A heat sink as claimed in claims 2 or 1, wherein said expansion member is positioned within a lower portion of said pin and remains therein following engagement of said pin to the base.

4. A heat sink as claimed in claim 3 wherein said expansion member comprises a bearing.

5. A heat sink as claimed in claim 3, wherein said expansion member is cylindrical.

6. A method for assembling a heat sink for use in an air-cooled electronic component, said heat sink comprising an array of pins extending outwardly from a base, at least one of said pins comprising a tube having an interior wall having a stepped configuration wherein an upper portion of said tube has a larger interior diameter than the interior diameter of a lower portion thereof, said method comprising the steps of inserting said lower portion into a recess within said base and inserting an expansion member into an open upper end of said tube, through said upper portion and into said lower portion, wherein said expansion member is adapted to freely slide through said upper portion and to engage the interior wall of said lower portion so as to expand said lower portion outwardly to clampingly engage said tube within said recess.

* * * * *